United States Patent
Kamgaing

(10) Patent No.: US 7,548,138 B2
(45) Date of Patent: Jun. 16, 2009

(54) COMPACT INTEGRATION OF LC RESONATORS

(75) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 11/240,305

(22) Filed: Sep. 29, 2005

(65) Prior Publication Data
US 2007/0069835 A1  Mar. 29, 2007

(51) Int. Cl.
*H03H 7/01*  (2006.01)
(52) U.S. Cl. .................................. 333/185; 333/175
(58) Field of Classification Search ............. 333/175, 333/185
See application file for complete search history.

(56) References Cited

U.S. PATENT DOCUMENTS

| 4,591,814 | A | * | 5/1986 | Ito et al. ................ 333/177 |
| 4,876,555 | A | * | 10/1989 | Jorgensen ............... 343/895 |
| 5,231,078 | A | * | 7/1993 | Riebman et al. ........... 505/192 |
| 5,618,777 | A | * | 4/1997 | Hey-Shipton et al. ....... 505/210 |
| 2002/0097114 | A1 | * | 7/2002 | Nakano ................ 333/175 |

\* cited by examiner

*Primary Examiner*—Benny Lee
(74) *Attorney, Agent, or Firm*—Blakely, Sokoloff, Taylor & Zafman LLP

(57) ABSTRACT

A technique to provide a compact integration of inductor-capacitor resonator a capacitor having a top plate and a bottom plate embedding a dielectric layer. The top and bottom plates are substantially parallel to each other. An inductor having a first end is coupled to the capacitor at the bottom plate. The inductor has N turns surrounding the bottom plate in a spiral geometry. The inductor is co-planar to one of the top and bottom plates and ends at a second end.

23 Claims, 8 Drawing Sheets

US 7,548,138 B2

COMPACT INTEGRATION OF LC RESONATORS

BACKGROUND

1. Field of the Invention

Embodiments of the invention relate to the field of passive devices, and more specifically, to resonators.

2. Description of Related Art

In many radio frequency (RF) circuits for filtering and power supply (e.g., tank circuit) for voltage-controlled oscillator (VCO), resonators using inductors (L) and capacitors (C), referred to as LC resonators, occupy a large real estate due to relative arrangement of the capacitors and inductors.

Currently, LC resonators are designed using a side-by-side arrangement in which the capacitor is placed next to the inductor. For advanced packaging technologies having embedded passive (EP) components capability, the minimum via pad size needed to connect the underpass or the escape of the inductor is comparable to the typical plate size of a parallel-plate capacitor. When this underpass is connected to the top plate of the capacitor, an additional connecting via is needed. This additional via and the side-by-side arrangement of the capacitor and the inductor lead to an increase in size of the resonator. In addition, this design makes it difficult to control the overall inductance of the circuit.

BRIEF DESCRIPTION OF THE DRAWINGS

Embodiments of the invention may best be understood by referring to the following description and accompanying drawings that are used to illustrate embodiments of the invention. In the drawings.

DESCRIPTION

An embodiment of the present invention is a technique to provide a compact integration of inductor-capacitor resonator. A capacitor having a top plate and a bottom plate embedding a dielectric layer. The top and bottom plates are substantially parallel to each other. An inductor having a first end is coupled to the capacitor at the bottom plate. The inductor has N turns surrounding the bottom plate in a spiral geometry. The inductor is co-planar to one of the capacitor plates and ends at a second end.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

Figure 1:
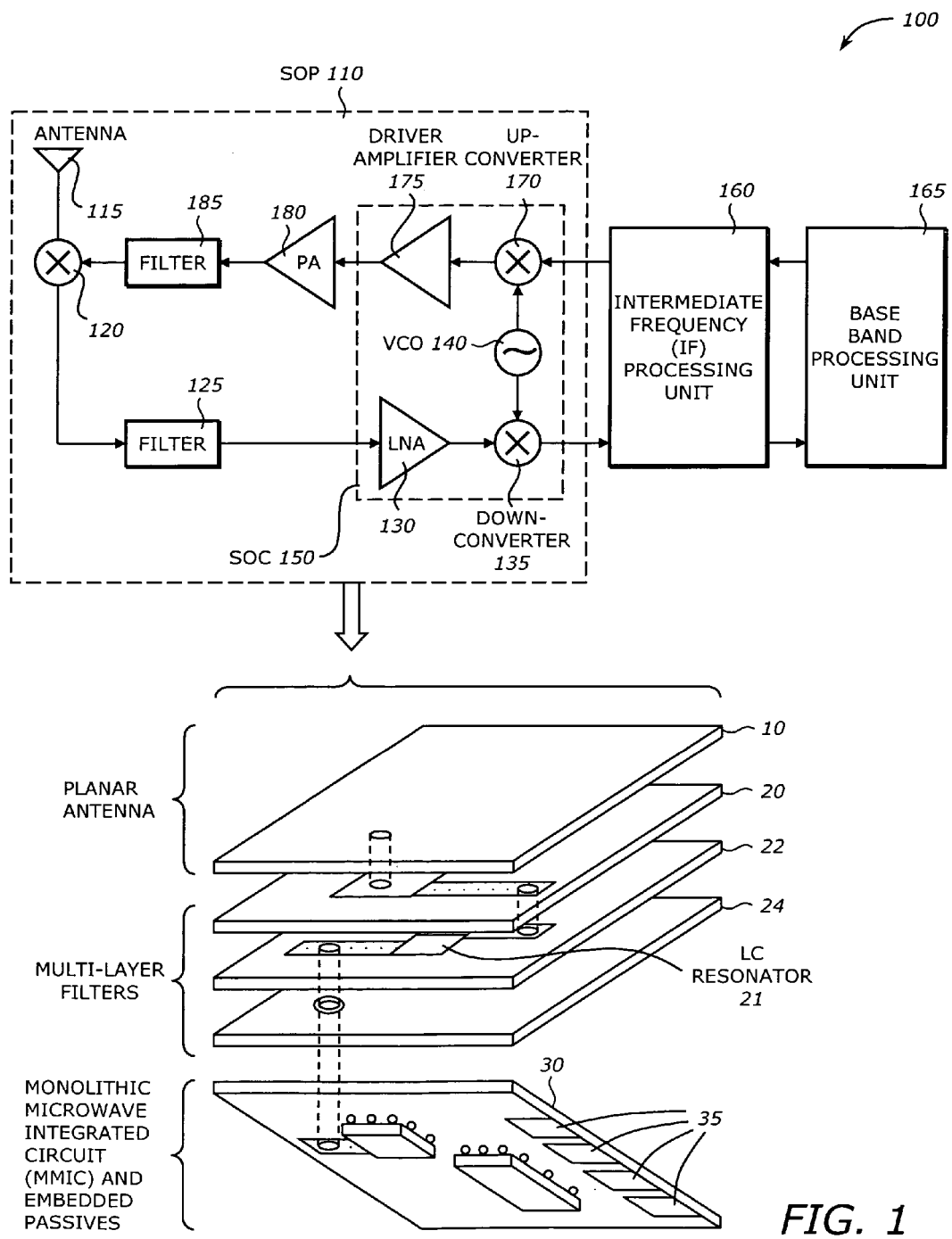
FIG. 1 is a diagram illustrating a system in which one embodiment of the invention can be practiced.

FIG. 1 is a diagram illustrating a system 100 in which one embodiment of the invention can be practiced. The system 100 represents a mobile communication module. It includes a system on package (SOP) 110, an intermediate frequency (IF) processing unit 160, and a base-band processing unit 165.

The SOP 110 represents the front end processing unit for the mobile communication module. It is a transceiver incorporating on-package integrated lumped passive components as well as RF components. It includes an antenna 115, a duplexer 120, a filter 125, a system-on-chip (SOC) 150, a power amplifier (PA) 180, and a filter 185.

The antenna 115 receives and transmits RF signals. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 170, and a driver amplifier 175. The LNA 130 amplifies the received signal. The down converter 135 is a mixer to convert the RF signal to the IF band to be processed by the IF processing unit 160. The up converter 170 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The base-band processing unit 165 may include analog-to-digital converter (ADC) and digital-toanalog converter (DAC) to convert analog signal to digital data and vice versa. It may include a digital processor with memory and peripheral components to process digital data.

The SOP 110 may be a multi-layer three-dimensional (3D) architecture for a monolithic microwave integrated circuit (MMIC) with EP technology. It may be implemented using Low Temperature Co-fired Ceramics (LTCC) and organic-based technologies. The 3D architecture may include multiple layers include a layer 10 to implement the antenna 115, layers 20, 22, and 24 for the filters 125 and 185, and layer 30 for the SOC 150 and the passive components using EP technology. In particular, layers 20, 22, and 24 may contain a LC resonator 21 that may be used as part of the filters 125 and 185, or the VCO 140, or any other RF circuits. The monolithic microwave integrated circuit (MMIC) and embedded passive components may include layer 30.

The LC resonator 21 may be used in any applications that require a compact integration of inductors and capacitors. It may be used in RF filter circuits, VCO, etc. Typically, the packaging technology involves embedded passives with multiple layers. It may also be used with any other packaging technologies such as Flip-Chip Ball Grid Array (FCBGA). The LC resonator 21 may be designed as a series resonator or a parallel resonator. It may operate in RF frequency up to several GHz. For example, the resonance frequency may be at 3.8 GHz.

Figure 2A:
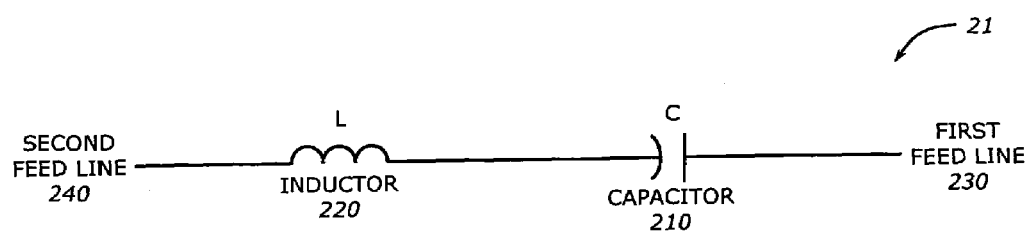
FIG. 2A is a diagram illustrating a series resonator circuit according to one embodiment of the invention.

FIG. 2A is a diagram illustrating a series resonator circuit 21 according to one embodiment of the invention. The circuit 21 may include a capacitor (C) 210 and an inductor (L) 220.

The capacitor 210 and the inductor 220 are electrically connected in series. One plate of the capacitor 210 is connected to a first feed line 230. One end of the inductor is connected to a second feed line 240 or is available as a contact point. The first and second feed lines 230 and 240 are used for connections to other components or parts in the package.

Figure 2B:
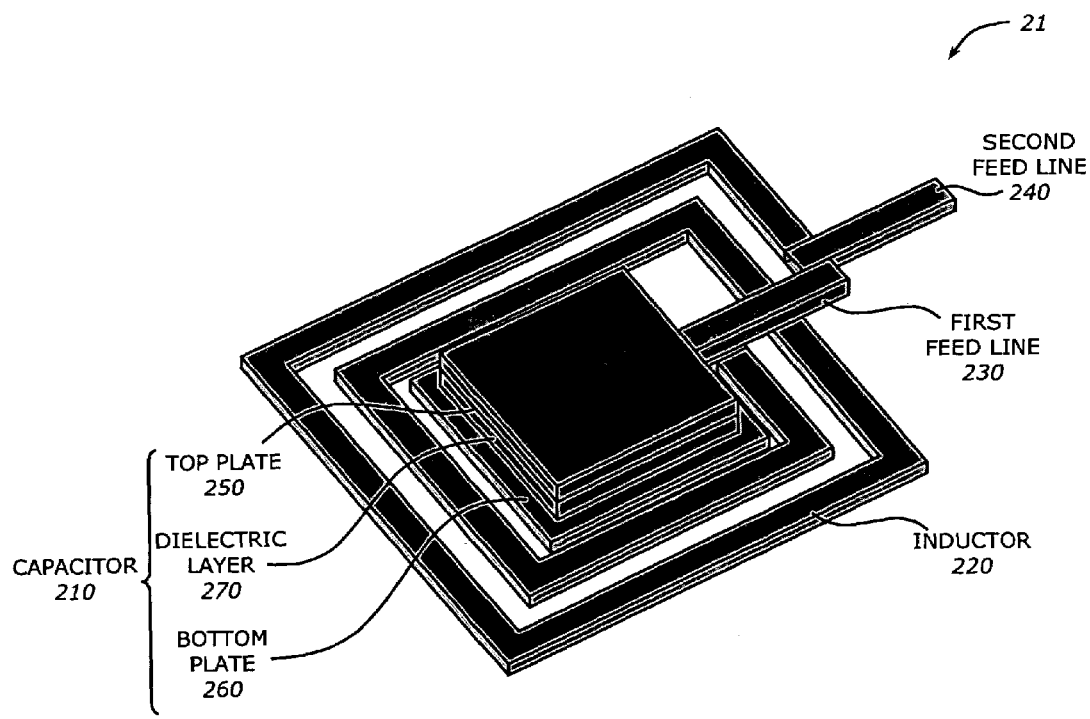
FIG. 2B is a diagram illustrating a series resonator according to one embodiment of the invention.

FIG. 2B is a diagram illustrating a series resonator 21 according to one embodiment of the invention. The series resonator 21 is shown in three-dimensional (3-D) view. It includes a capacitor 210 and an inductor 220.

The capacitor 210 includes a top plate 250 and a bottom plate 260. These two plates are typical metal and serve as two electrodes for the capacitor. The top and bottom plates 250 and 260 embed a dielectric layer 270. The dielectric layer may be made of materials having a high dielectric constant (high-k). The dielectric constant, the thickness of the dielectric material, and the dimensions of the top and bottom plates 250 and 260 may be selected to provide appropriate capacitance values according to the application. The capacitance may be a function of the area of the top and bottom plates 250 and 260. For example, the capacitance values may be in the range of between $0.5 \text{ pF/mm}^2$ to $80 \text{ pF/mm}^2$ for RF circuits and even higher for non-RF applications such as power delivery.

The inductor 220 may include a metal trace having two ends: a first end and a second end. The first end may be connected to the capacitor 210 at the bottom plate 260. Typically, the inductor 220 is substantially planar or co-planar to one of the top and bottom plates 260. In other words, it may be in the same plane or approximately in the same plane with the bottom plate 260. The inductor 220 may have a spiral geometry and may have N turns where N may be any real number. In one embodiment, N may range from ½ to 10. The spiral geometry of the inductor 220 may start from the first end, then surround the bottom plate 260 and then end at the second end. In essence, the capacitor 210 is placed inside the inductor 220. The inductance of the inductor 220 may be any appropriate values. It may be in the range of 200 pH to 20 nH for RF applications. The inductor 220 may be embedded into a multi-layer build-up structure as single or multi-layer traces. The spiral geometry may be rectangle, square, or circular. Similarly, the capacitor plates may have a rectangular, circular, or any other polygonal shape. When multiple LC resonators are used, the inductors may form in an L-shape spiral geometry. The spiral inductor resonator segments may be separate, partially overlap, or fully overlap.

To provide connections or contact points to other components or devices, two feed lines or feeds may be used. The first feed 230 may be connected to the top plate 250. The second feed 240 may be connected to the second end of the inductor 220.

By placing the capacitor 210 within the inductor 220, substantial area saving may be achieved. Compared to the side-by-side arrangement, this layout may achieve about 50% area reduction. In addition, it does not require vias as in the side-by-side arrangement, unless there is a requirement for a routing layer. This layout also reduces parasitic resistance or inductance due to the flexibility to connect the feed lines from any side (or location) of the capacitor plates interconnects.

Figure 2C:
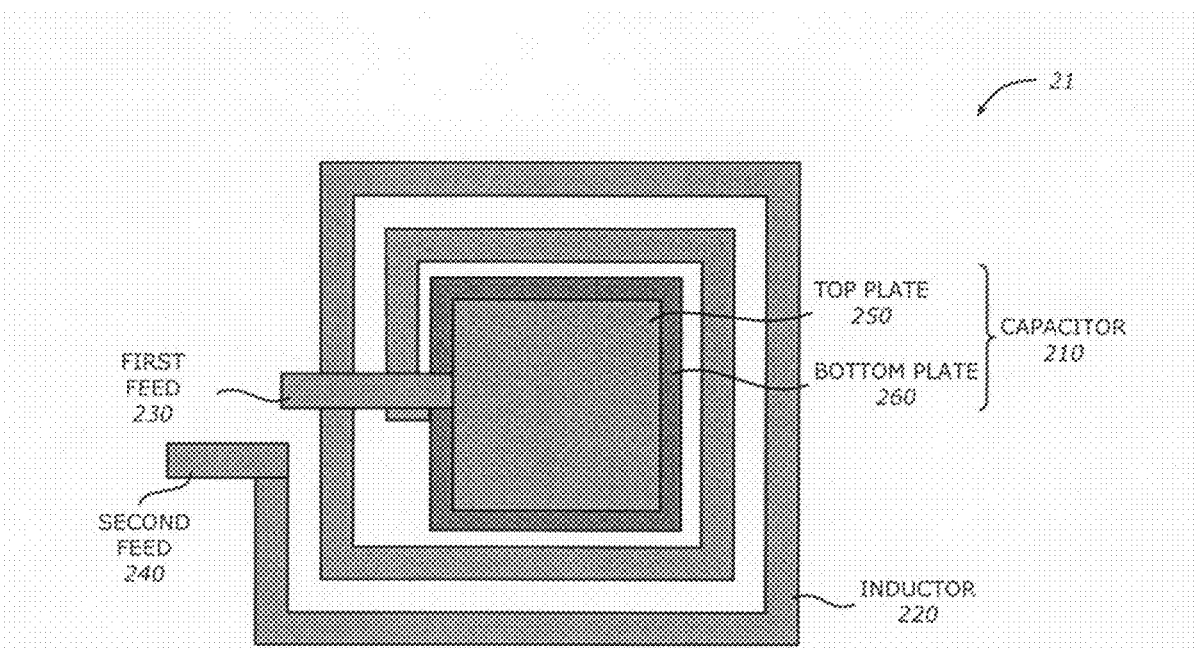
FIG. 2C is a diagram illustrating a top view of the series resonator shown in FIG. 2B according to one embodiment of the invention.

FIG. 2C is a diagram illustrating a top view of the series resonator 21 shown in FIG. 2B according to one embodiment of the invention. The top view shows the capacitor 210, the inductor 220, the first feed line 230, and the second feed line 240. Typically, the top plate 250 and the bottom plate 260 are of different sizes. In one embodiment, the bottom plate 260 is larger than the top plate 250.

Figure 2D:
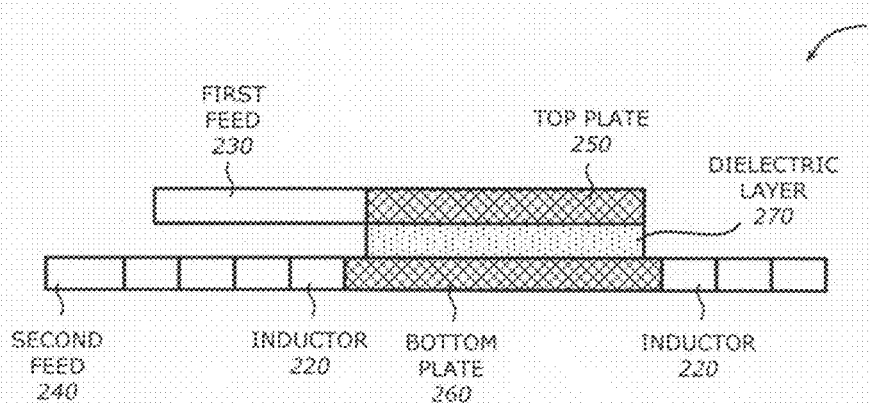
FIG. 2D is a diagram illustrating a side view of the series resonator shown in FIG. 2B according to one embodiment of the invention.

FIG. 2D is a diagram illustrating a side view of the series resonator 21 shown in FIG. 2B according to one embodiment of the invention. The side view shows the dielectric layer 270 being embedded between the top and bottom plates 250 and 260. The top plate 250 and the bottom plate 260 are substantially parallel to each other. The first and second feed lines 230 and 240 may be at any suitable orientation or angle with respect to the top plate 250 and the inductor 220.

Figure 3A:
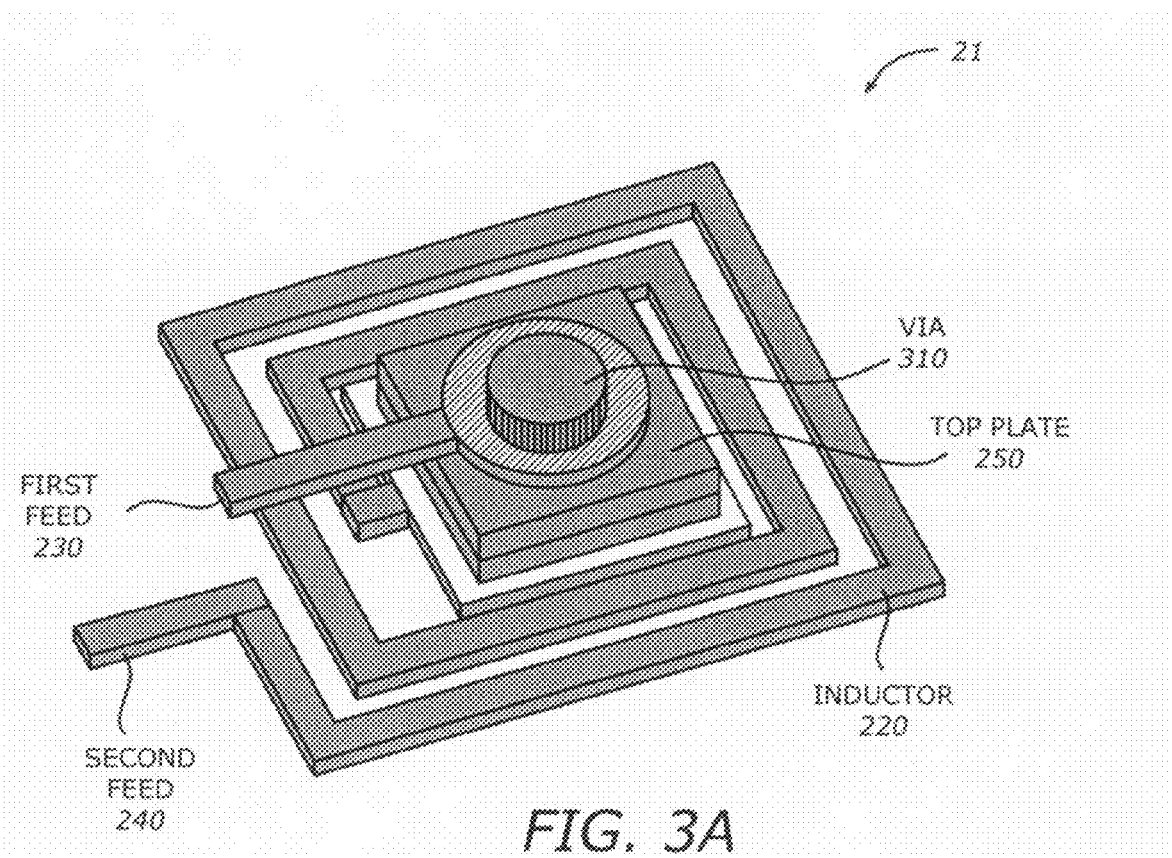
FIG. 3A is a diagram illustrating a series resonator with via according to one embodiment of the invention.

FIG. 3A is a diagram illustrating a series resonator 21 with via according to one embodiment of the invention. The series resonator 21 in this embodiment is substantially similar to the one shown in FIGS. 2A through 2D except that it incorporates a via 310 on the top plate 250. The inductor 220 is shown to be connected to the second feed line 240 at the second end. The via 310 connects the first feed 230 and the top plate 250. The via 310 may have any convenient shape and size comparable with the top plate 250 (e.g., square 140□m x 140□m). Note that a typical via may be circular with diameter of 64□m or more. In some design technology, the via pad on the other hand, may have a minimum diameter of 124□m. The via size may be selected to control the parasitic inductance. In addition, an array of vias may be used in place of single via to control the inductance and resistance.

Figure 3B:
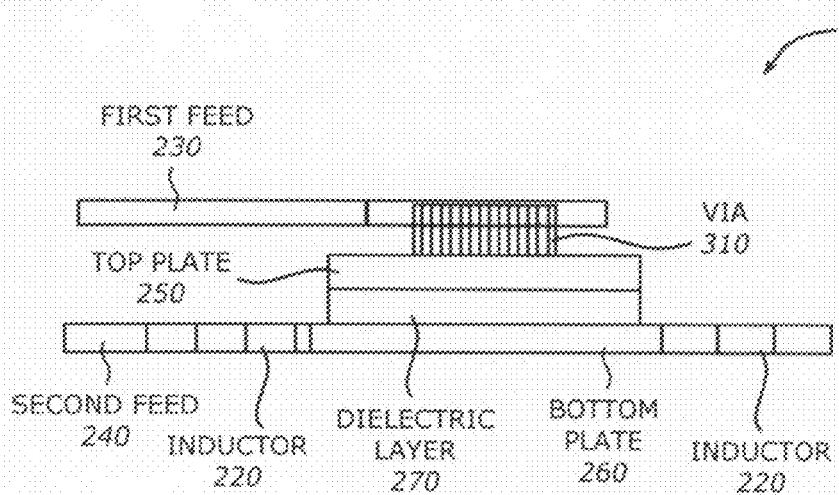
FIG. 3B is a diagram illustrating a side view of the series resonator with via shown in FIG. 3A according to one embodiment of the invention.

FIG. 3B is a diagram illustrating a side view of the series resonator 21 with via shown in FIG. 3A according to one embodiment of the invention. The side view shows the inductor 220, the second feed line 240, the bottom plate 260, and the dielectric layer 270. The via 310 connects the top plate 250 and the first feed line 230. It may provide a contact point or connections to a routing layer, or other components or devices in the package.

Figure 4A:
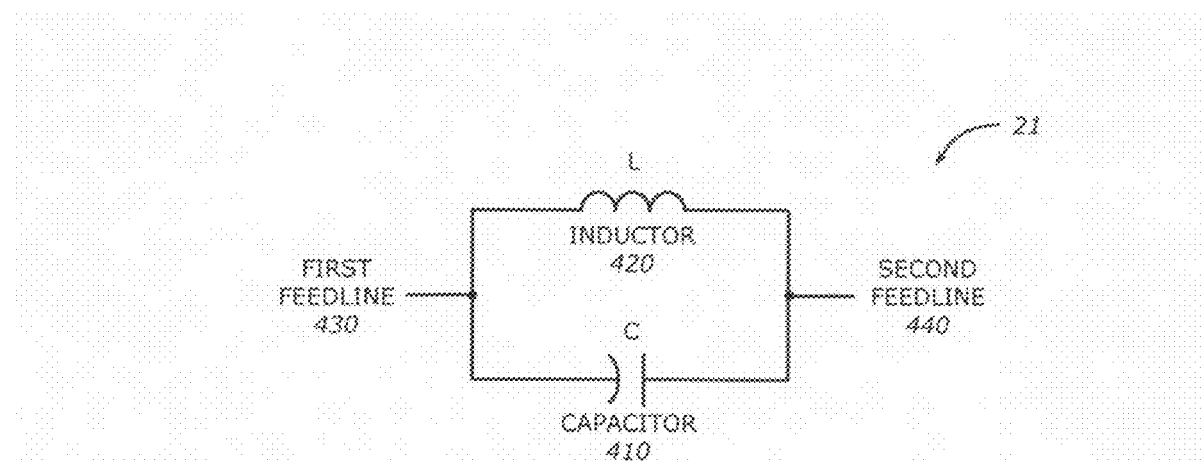
FIG. 4A is a diagram illustrating a parallel resonator circuit according to one embodiment of the invention.

FIG. 4A is a diagram illustrating a parallel resonator circuit 21 according to one embodiment of the invention. The circuit 21 includes a capacitor (C) 410 and an inductor (L) 420. The capacitor 410 and the inductor 420 are electrically connected in parallel at two terminals corresponding to first feed line 430 and second feed line 440.

Figure 4B:
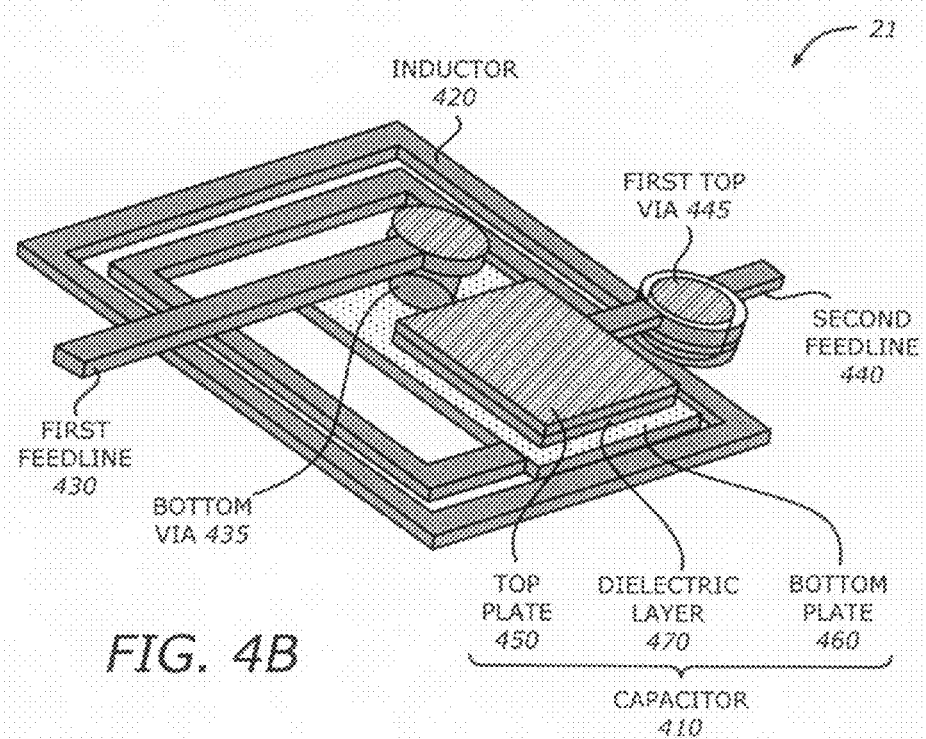
FIG. 4B is a diagram illustrating a parallel resonator according to one embodiment of the invention.

FIG. 4B is a diagram illustrating a parallel resonator 21 according to one embodiment of the invention. The parallel resonator 21 includes the capacitor 410 and the inductor 420.

The capacitor 410 and the inductor 420 are similar to the respective capacitor and inductor in the series resonator. The main difference is the connections to form a electrically parallel circuit. As in the series resonator shown in FIGS. 2A-2D, and 3A-3B, the capacitor 410 includes a top plate 450 and a bottom plate 460. The two plates are substantially parallel and embed a dielectric layer 470. The inductor 420 is connected to the capacitor 410 at the bottom plate 460 and surrounds the capacitor 410 in a spiral geometry. As in the series resonator, the spiral geometry may be square, rectangular, or circular. The number of turns may range from ½ to 10.

The first feed line 430 is connected to the bottom plate 460 using a bottom via 435. The second feed line 440 is connected to the top plate 450 and the second end of the inductor 420 at a first top via 445. This connection is such that the capacitor 410 and the inductor 420 are electrically in parallel between the first and the second feed lines 430 and 440 as shown in FIG. 4A.

Figure 4C:
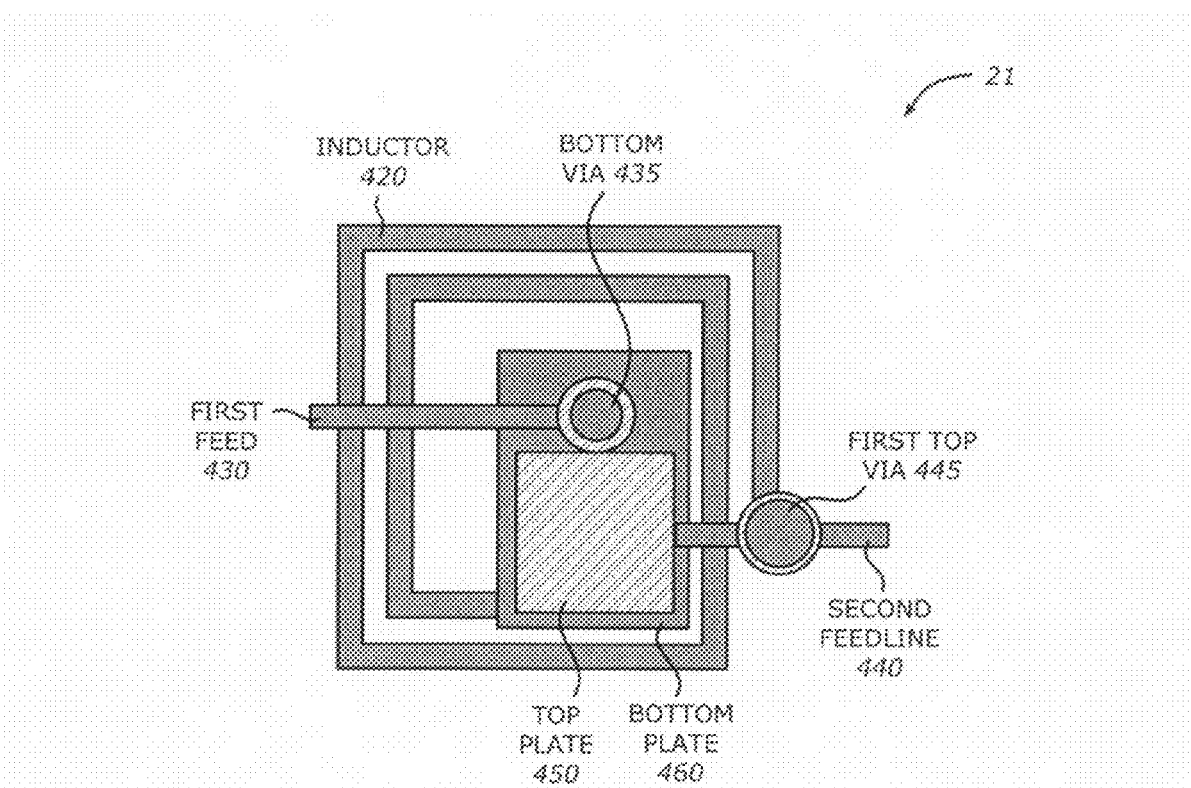
FIG. 4C is a diagram illustrating a top view of the parallel resonator shown in FIG. 4B according to one embodiment of the invention.

FIG. 4C is a diagram illustrating a top view of the parallel resonator 21 shown in FIG. 4B according to one embodiment of the invention. The top view shows the inductor 420 and the first top via 445. The bottom plate 460 is typically larger than the top plate 450 such that there is an exposed area to provide space for the first feed 430 and bottom via 435.

Figure 4D:
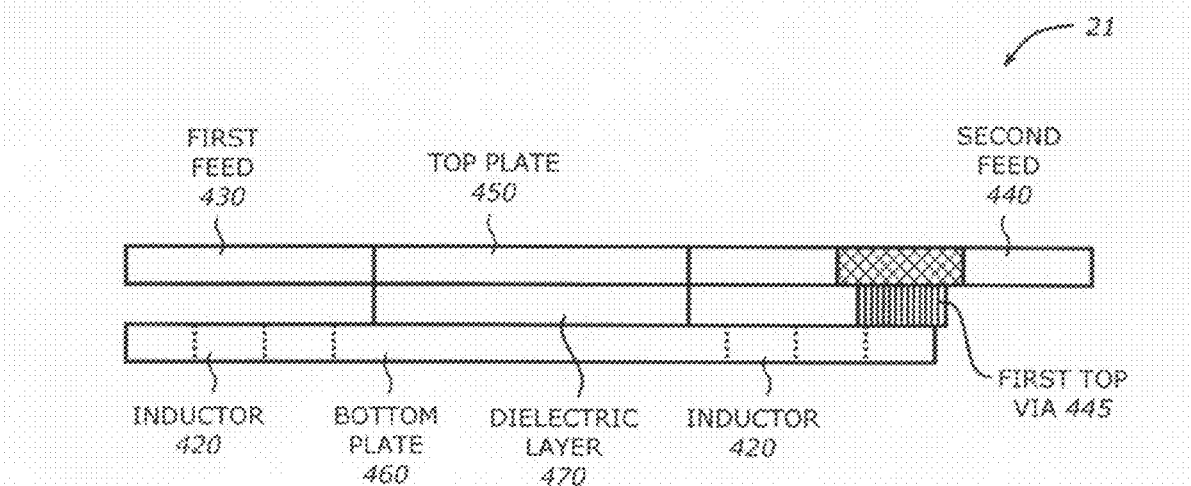
FIG. 4D is a diagram illustrating a side view of the parallel resonator shown in FIG. 4B according to one embodiment of the invention.

FIG. 4D is a diagram illustrating a side view of the parallel resonator 21 shown in FIG. 4B according to one embodiment of the invention. The side view shows the dielectric layer 470. The first feed 430 and the second feed 440 may be at any suitable orientation or angle with respect to the top and bottom plates 450 and 460. In addition, the height of the first top via 445 may be such that it is approximately equal to the distance between the plane of the inductor and the plane of the top plate 450 to reduce any mechanical stress between the second feed 440 and the inductor 420.

Figure 5A:
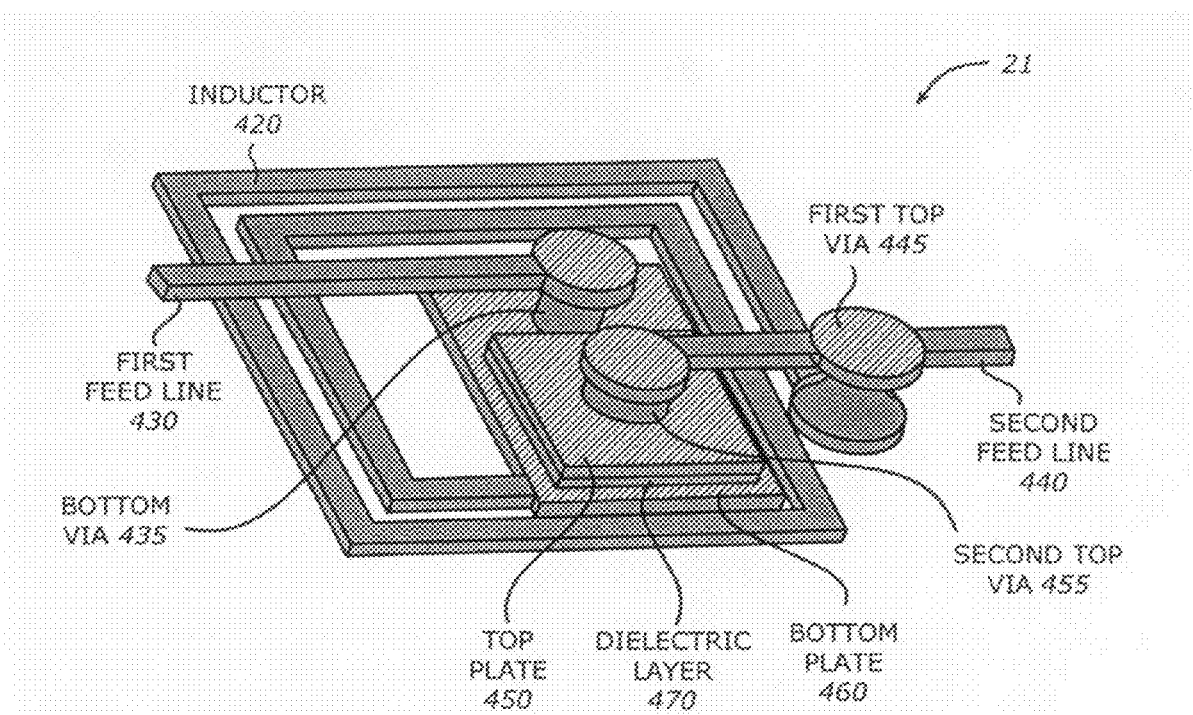
FIG. 5A is a diagram illustrating a parallel resonator with a second top via according to one embodiment of the invention.

FIG. 5A is a diagram illustrating a parallel resonator 21 with a second top via according to one embodiment of the invention. The parallel resonator 21 includes the inductor 420, the first feed line 430, the bottom via 435, the first top via 445, the bottom plate 460, and the dielectric layer 470. The parallel resonator 21 in FIG. 5A is similar to that shown in FIG. 4B except that there is a second top via 455 that connects the second feed 440 to the top plate 450.

The second top via 455 provides connections to other components or devices in the package. It may be referred to as an escape via and is typically used when there are restrictions with the routing layer which may be part of the package. The height of the first top via 445 may be such that the second feed 440 is substantially parallel to the inductor plane to avoid mechanical stress or strain on the second feed 440.

Figure 5B:
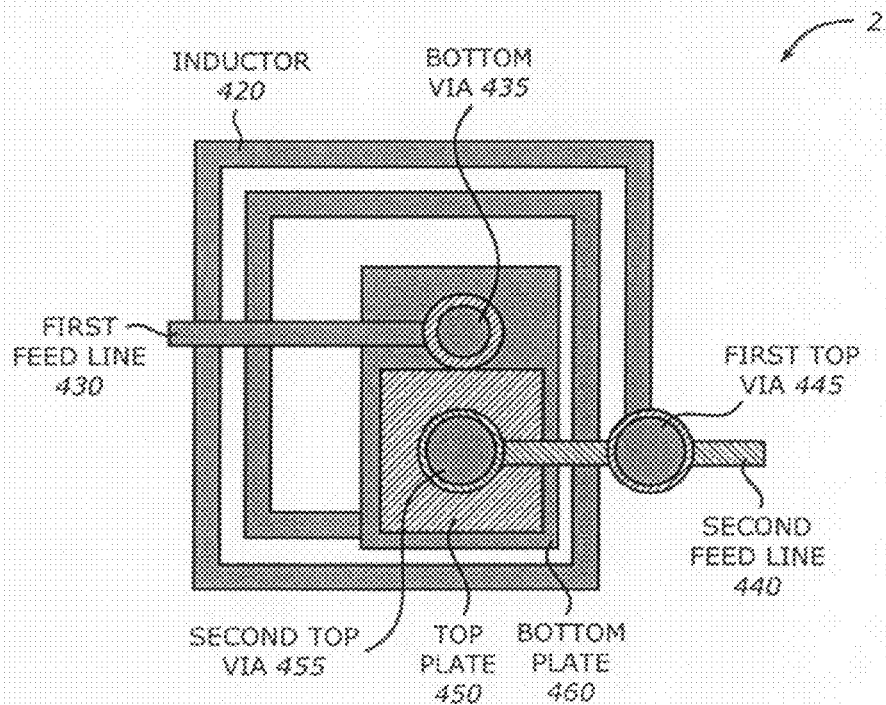
FIG. 5B is a diagram illustrating a top view of the parallel resonator with a second via shown in FIG. 5A according to one embodiment of the invention.

FIG. 5B is a diagram illustrating a top view of the parallel resonator 21 with a second via shown in FIG. 5A according to one embodiment of the invention. The top view shows the inductor 420, the first feed line 430, the second feed line 440, the bottom via 435, the first top via 445, the bottom plate 460, and the dielectric layer 470. The second top via 455 is preferably located at approximately the center of the top plate 450 and is aligned with the first top via 445 to provide mechanical stability.

Figure 6:
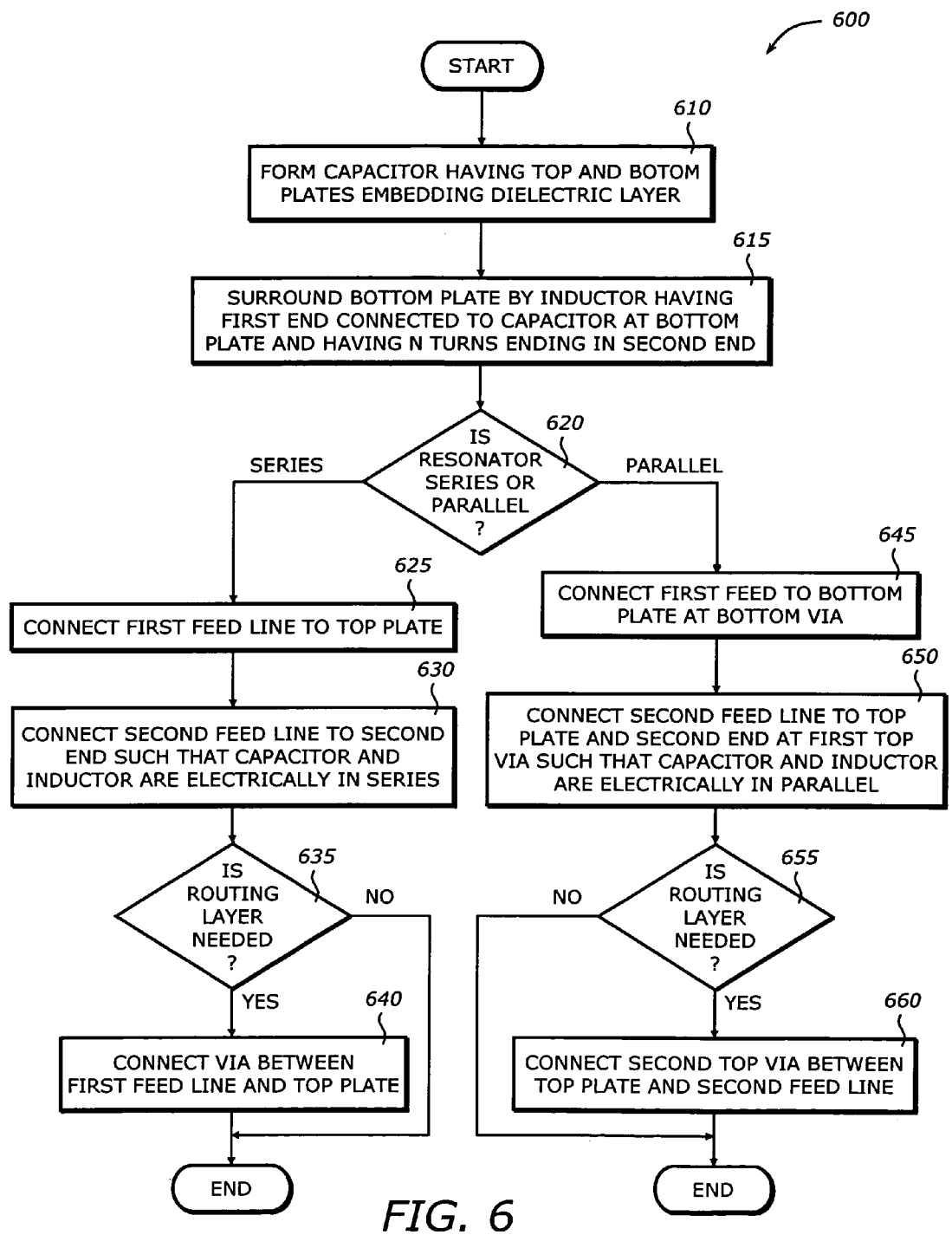
FIG. 6 is a flowchart illustrating a process to form a compact integrated LC resonator according to one embodiment of the inventor.

FIG. 6 is a flowchart illustrating a process 600 to form a compact integrated LC resonator according to one embodiment of the invention. It is noted that the flowchart does not necessarily show the exact sequence of the fabrication phases or operations. For example, the embedded passive components are fabricated as part of the package process. In addition, capacitors and inductors may be fabricated simultaneously.

Upon START, the process 600 forms a capacitor having top and bottom plates that embed a dielectric layer (Block 610). The top and bottom plates are substantially parallel and are typically made of metal. Then, the process 600 surrounds the bottom plate by an inductor having a first end connected to the capacitor at the bottom plate and having N turns ending in a second end (Block 615). The values of N may range from ½ to 10. Next, the process 600 determines if the LC resonator is series or parallel (Block 620).

If the LC resonator is a series resonator, the process 600 connects a first feed to the top plate (Block 625). Then, the process 600 connects the second feed to the second end such that the capacitor and the inductor are electrically in series (Block 630). Next, the process 600 determines if a routing layer for additional connections is needed (Block 635). If so, the process 600 connects a via between the first feed and the top plate (Block 640) and is then terminated. Otherwise, the process 600 is terminated at the END block.

If the LC resonator is a parallel resonator, the process 600 connects a first feed to the bottom plate at a bottom via (Block 645). Then, the process 600 connects the second feed to the top plate and the second end at a first top via such that the capacitor and the inductor are electrically in parallel (Block 650). Next, the process 600 determines if a routing layer for additional connections is needed (Block 655). If so, the process 600 connects a second top via between the second feed and the top plate (Block 660) and is then terminated. Otherwise, the process 600 is terminated at the END block.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
    a capacitor having a top plate and a bottom plate embedding a dielectric layer, the top and bottom plates being substantially parallel to each other;
    an inductor having a first end coupled to the capacitor at the bottom plate and having N turns surrounding the bottom plate and the dielectric layer in a spiral geometry, the inductor being co-planar to the bottom plate and ending at a second end, the inductor and the capacitor forming a series or parallel resonator;
    a first feed line coupled to the top plate; and
    a via connecting between the first feed line and the top plate to provide a connection point, the via being a drilled hole.

2. The apparatus of claim 1 further comprising:
    a second feed line coupled to the second end such that the capacitor and the inductor are electrically in series between the first and second feed lines.

3. The apparatus of claim 1 wherein the via is sized to control parasitic inductance.

4. The apparatus of claim 1 wherein N ranges from ½ to 10.

5. An apparatus comprising:
    a capacitor having a top plate and a bottom plate embedding a dielectric layer, the top and bottom plates being substantially parallel to each other;
    an inductor having a first end coupled to the capacitor at the bottom plate and having N turns surrounding the bottom plate and the dielectric layer in a spiral geometry, the inductor being co-planar to the bottom plate and ending at a second end, the inductor and the capacitor forming a series or parallel resonator;

a first feed line coupled to the bottom plate at a bottom via;
a second feed line coupled to the top plate and the second end at a first top via such that the capacitor and the inductor are electrically in parallel between the first and the second feeds; and
a second top via connecting between the top plate and the second feed line to provide a connection point, each of the vias being a drilled hole.

6. The apparatus of claim 5 wherein the bottom plate is larger than the top plate.

7. The apparatus of claim 5 wherein each of the vias is sized to control parasitic inductance.

8. A method comprising:
forming a capacitor having a top plate and a bottom plate embedding a dielectric layer, the top and bottom plates being substantially parallel to each other;
surrounding the bottom plate and the dielectric layer by an inductor having a first end coupled to the capacitor at the bottom plate and having N turns in a spiral geometry, the inductor being co-planar to the bottom plate and ending at a second end, the inductor and the capacitor forming a series or parallel resonator;
connecting a first feed line to the top plate; and
connecting a via between the first feed line and the top plate to provide a connection point, the via being a drilled hole.

9. The method of claim 8 further comprising:
connecting a second feed line to the second end such that the capacitor and the inductor are electrically in series between the first and second feed lines.

10. The method of claim 8 wherein the via is sized to control parasitic inductance.

11. The method of claim 8 wherein N ranges from ½ to 10.

12. A method comprising:
forming a capacitor having a top plate and a bottom plate embedding a dielectric layer, the top and bottom plates being substantially parallel to each other;
surrounding the bottom plate and the dielectric layer by an inductor having a first end coupled to the capacitor at the bottom plate and having N turns in a spiral geometry, the inductor being co-planar to the bottom plate and ending at a second end, the inductor and the capacitor forming a series or parallel resonator;
connecting a first feed line to the bottom plate at a bottom via;
connecting a second feed line to the top plate and the second end at a first top via such that the capacitor and the inductor are electrically in parallel between the first and the second feed lines; and
connecting a second top via between the top plate and the second feed line to provide a connection point, each of the vias being a drilled hole.

13. The method of claim 12 wherein the bottom plate is larger than the top plate.

14. The method of claim 12 wherein each of the vias is sized to control parasitic inductance.

15. A system comprising:
a base-band processing unit to process base-band data;
and intermediate frequency (IF) processing unit coupled to the base-band processing unit to process IF signals; and
a system on package (SOP) coupled to the IF processing unit to process radio frequency (RF) signals; the SOP comprising multiple layers having an antenna layer, an embedded passive (EP) components layer, and a filter layer, the filter layer comprising:
a capacitor having a top plate and a bottom plate embedding a dielectric layer, the top and bottom plates being substantially parallel to each other, and
an inductor having a first end coupled to the capacitor at the bottom plate and having N turns surrounding the bottom plate and the dielectric layer in a spiral geometry, the inductor being co-planar to the bottom plate and ending at a second end, the inductor and the capacitor forming a series or parallel resonator.

16. The system of claim 15 wherein the filter layer further comprises:
a first feed line coupled to the top plate; and
a second feed line coupled to the second end such that the capacitor and the inductor are electrically in series between the first and second feed lines.

17. The system of claim 16 wherein the filter layer further comprises:
a via connecting between the first feed line and the top plate to provide a connection point.

18. The system of claim 15 wherein the filter layer further comprises:
a first feed line coupled to the bottom plate at a bottom via; and
a second feed line coupled to the top plate and the second end at a first top via such that the capacitor and the inductor are electrically in parallel between the first and the second feed lines.

19. The system of claim 18 wherein the filter layer further comprises:
a second top via connecting between the top plate and the second feed line to provide a connection point.

20. The system of claim 18 wherein the bottom plate is larger than the top plate.

21. An apparatus comprising:
a capacitor having a top plate and a bottom plate embedding a dielectric layer, the top and bottom plates being substantially parallel to each other, the bottom plate being larger than the top plate;
an inductor having a first end coupled to the capacitor at the bottom plate and having N turns surrounding the bottom plate and the dielectric layer in a spiral geometry, the inductor being co-planar to the bottom plate and ending at a second end;
a first feed line coupled to the top plate;
a second feed line coupled to the second end such that the capacitor and the inductor are electrically in series between the first and second feed lines; and
a via connecting between the first feed line and the top plate to provide a connection point, the via being a drilled hole.

22. An apparatus comprising:
a capacitor having a top plate and a bottom plate embedding a dielectric layer, the top and bottom plates being substantially parallel to each other, the bottom plate being larger than the top plate and providing an exposed area;
an inductor having a first end coupled to the capacitor at the bottom plate and having N turns surrounding the bottom plate and the dielectric layer in a spiral geometry, the inductor being co-planar to the bottom plate and ending at a second end;

a first feed line coupled to the bottom plate at a bottom via on the exposed area, the bottom via being a drilled hole; and a second feed line coupled to the top plate and the second end at a first top via such that the capacitor and the inductor are electrically in parallel between the first and the second feed lines.

23. The apparatus of claim 22 further comprising:

a second top via connecting between the top plate and the second feed line to provide a connection point.

* * * * *